United States Patent [19]

Teraoka et al.

[11] Patent Number: 4,839,713
[45] Date of Patent: Jun. 13, 1989

[54] PACKAGE STRUCTURE FOR SEMICONDUCTOR DEVICE

[75] Inventors: Yasuhiro Teraoka; Tetsuya Ueda; Hideya Yagoura; Haruo Shimamoto; Shigeyuki Nango; Toshinobu Banjo; Hiroshi Seki, all of Itami, Japan

[73] Assignee: Mitsubishi Denki Kabushiki Kaisha, Japan

[21] Appl. No.: 156,571

[22] Filed: Feb. 17, 1988

[30] Foreign Application Priority Data

Feb. 20, 1987 [JP] Japan .................................. 62-38555
Aug. 5, 1987 [JP] Japan ................................. 62-196835

[51] Int. Cl.⁴ ...................... H01L 29/00; H01R 43/02
[52] U.S. Cl. .......................................... 357/70; 357/72; 357/74
[58] Field of Search ............................. 357/70, 72, 74

[56] References Cited

U.S. PATENT DOCUMENTS 4,330,790  5/1982  Burns ..................................... 357/70
4,649,415  3/1987  Hebert .................................... 357/70

*Primary Examiner*—Andrew J. James
*Assistant Examiner*—David Soltz
*Attorney, Agent, or Firm*—Leydig, Voit & Mayer

[57] ABSTRACT

A package structure comprising a metallic cap having a bottom wall to which the bottom surface of the semiconductor chip is electrically and mechanically connected, a side wall extending from said bottom wall and surrounding the semiconductor chip, and a flange extending outwardly from said side wall substantially parallel to said bottom wall, said flange supporting the lead conductors thereon through an electrically insulating material. The electrical connection means is disposed between the metallic cap flange and the lead conductor for establishing an electrical connection therebetween. The electrical connection means may comprise an electrically conductive projection formed on the flange of the metal cap, extending through a notch in the insulating material and electrically connected to the lead conductor. The electrical connection means may be an electrically conductive bonding material filled within a cavity defined by an opening in the flange of the metal cap, a through hole in the insulating material and a connecting pad of the lead conductor.

4 Claims, 5 Drawing Sheets

PACKAGE STRUCTURE FOR SEMICONDUCTOR DEVICE

BACKGROUND OF THE INVENTION

This invention relates to a package structure for a semiconductor device in which a semiconductor chip is wirebonded by the tape carrier bonding method.

The tape carrier bonding method (TAB method) is one of the wireless bonding methods. Since the TAB method allows high speed automatic bonding, the number of the semiconductor devices manufactured by this method is increasing.

When a semiconductor chip to which a bottom surface electrical potential is to be applied is manufactured by the TAB method, the bottom surface contact is obtained by bonding the bottom surface of the semiconductor chip to wiring on the substrate. The wiring is connected to a terminal electrode on the upper surface of the semiconductor chip by means of a lead conductor.

FIG. 1 is a perspective view showing a semiconductor chip secured on a tape base material by the TAB method, and FIG. 2 is a sectional side view of the semiconductor chip mounted to a substrate. In these FIGS. a semiconductor chip 1 has projecting electrodes 2 formed on its top surface. A tape base material 3 has formed therein an opening 3a within which the semiconductor chip 1 is disposed, and outer lead slits 3b along which the semiconductor chip is separated from the tape base material 3 during the semiconductor chip separating process which will be described in detail later. A plurality of lead wires 4 each including an inner lead 4a, an outer lead 4b and a test pad 4c are bonded to the tape base material 3. Thus, the semiconductor chip 1 is secured to the tape base material 3 by hot press bonding the projecting electrodes 2 of the semiconductor chip 1 to the inner leads 4a by the inner lead bonding step in the TAB method. The projecting electrodes 2 may be formed on the inner leads 4a instead of being formed on the semiconductor chip 1.

As seen from FIG. 2, the semiconductor chip 1 and the tape base material 3 are secured and protected by a sealing resin material 5. In order to electrically connect the semiconductor device and an external circuit, a substrate 6 is provided. The substrate 6 has formed on its upper surface substrate wiring 7a to which the outer lead 4b is connected, and substrate wiring 7b to which the bottom surface of the semiconductor chip 1 is electrically bonded by an electrically conductive bonding agent 8. The assembly formed on the substrate 6 is coated by a package resin 9.

During manufacture, the semiconductor chip 1 mounted to the tape base material 3, together with the outer leads 4b, is punched from the tape base material 3 at the position corresponding to the outer lead slits 3b with predetermined dimensions. Then, the free ends of the outer leads 4b are bonded to the substrate wiring 7a and the bottom surface of the semiconductor chip 1 is bonded to the substrate wiring 7b. The bottom surface of the semiconductor chip 1 must also be electrically connected to the selected one of the projecting electrodes 2 on the top surface of the semiconductor chip 1 by means of the substrate wiring 7b and an unillustrated lead wire between the substrate wiring 7b and the electrode 2.

Thus, the semiconductor chip requiring a bottom surface potential and mounted to the tape base material by the TAB method has an electrical connection between its top and bottom surfaces only after the semiconductor chip has been finally bonded to the surface. Therefore, it is impossible to conduct the necessary test on the semiconductor device immediately after the bonding of the inner leads. For these reasons, it was impossible to "burn in" the semiconductor devices in which the inner leads are not properly bonded to the semiconductor chip or the semiconductor devices in which a defect is generated within the semiconductor chip during the application of the sealing resin, decreasing the yield of the product. Also, the substrate to which the defective semiconductor chip has been bonded must be discarded even if the substrate itself is satisfactory.

SUMMARY OF THE INVENTION

Accordingly, an object of the present invention is to provide a package structure for a semiconductor device to be manufactured by the TAB method that allows device tests to be carried out immediately after bonding of the inner leads.

Another object of the present invention is to provide a package structure for a semiconductor device to be manufactured by the TAB method that allows device tests to be carried out before bonding to the substrate.

A further object of the present invention is to provide a package structure for a semiconductor device having a high yield.

With the above objects in view, the semiconductor package structure of the present invention is intended for a semiconductor device to be manufactured by the TAB method and having a semiconductor chip having a first and a second electrodes on the first and the second major surfaces of the semiconductor chip, respectively, and lead conductors being electrically connected to the electrodes. The package structure comprises a metallic cap having a bottom wall to which the bottom surface of the semiconductor chip is electrically and mechanically connected, a side wall extending from the bottom wall and surrounding the semiconductor chip, and a flange extending outwardly from the side wall substantially in parallel to the bottom wall, the flange supporting the lead conductors thereon through an electrically insulating material. The lead conductors and the metallic cap are electrically connected to a wiring pattern disposed on an electrically insulating substrate. The package structure also comprises electrical connection means disposed between the flange of the metallic cap connected to the second electrode of the semiconductor chip and at least one of the lead conductors to be connected to the second electrode for establishing an electrical connection therebetween.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 4:
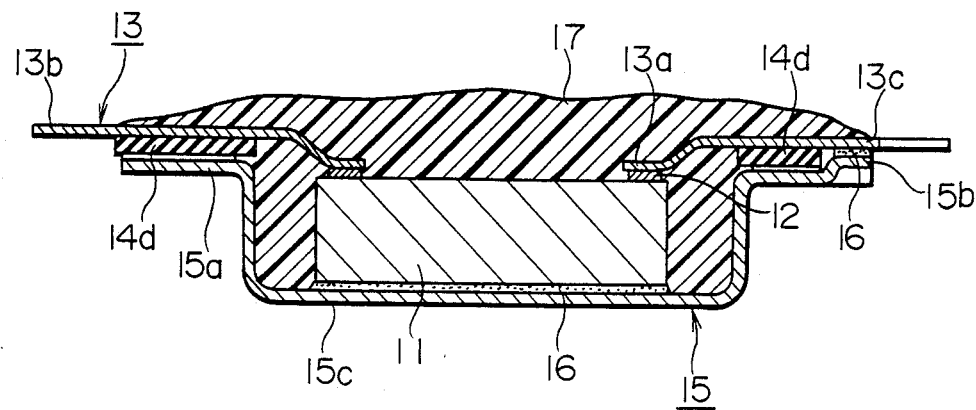
FIG. 4 is a sectional side view of the semiconductor package structure taken along line IV—IV of FIG. 3.
Figure 5:
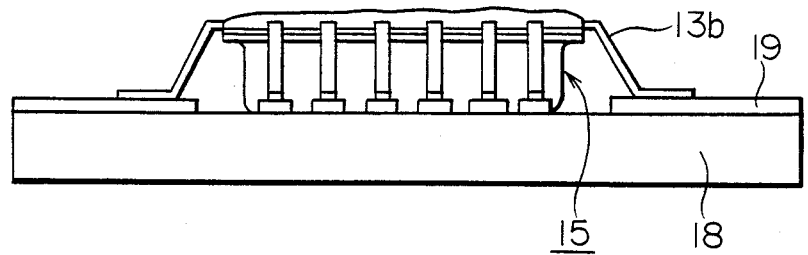
FIG. 5 is a side view of a semiconductor device in which the semiconductor package is mounted to a substrate.
Figure 6:
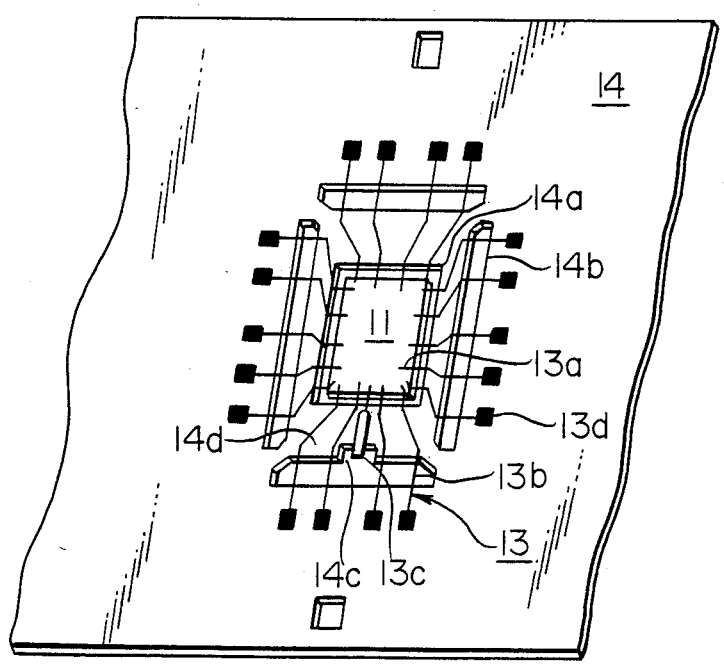
FIG. 6 is a fragmentary perspective view of a semiconductor chip attached to a tape base material according to the TAB method of the present invention.

FIGS. 3 to 7 illustrate a semiconductor package structure of the present invention and a method for manufacturing a semiconductor package structure. In these FIGS., a semiconductor chip 11 has projection electrodes 12 on its upper or first major surface. As shown in FIG. 6, a plurality of lead conductors 13 are attached to a tape base material 14 of the tape carrier. Each of the lead conductors 13 comprises an inner lead 13a, an outer lead 13b and a test pad 13d attaached to the tape base material 14.

The tape base material 14 has a substantially rectangular opening 14a within which the seimconductor chip 11 is disposed and outer lead slits 14b along which the semiconductor chip 11 is separated from the tape base material 14 during the cutting step of the TAB method. Between the rectangular opening 14a and the slits 14b a substantially rectangular frame-shaped support portion 14d is defined.

Figure 7:
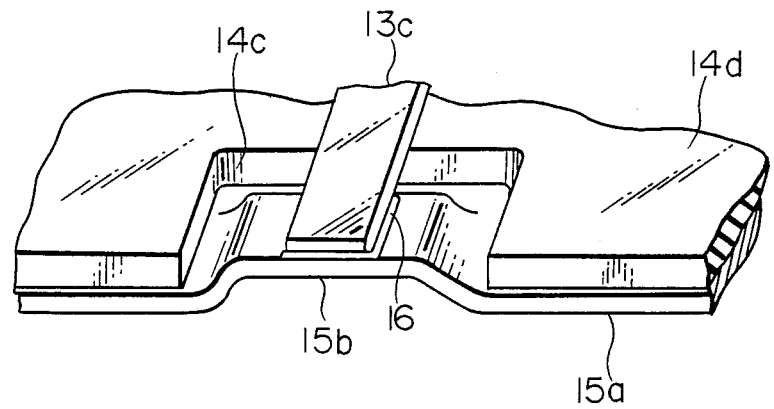
FIG. 7 is an enlarged perspective view showing the manner in which lead conductor is electrically connected to the metallic cap flange.
Figure 8:
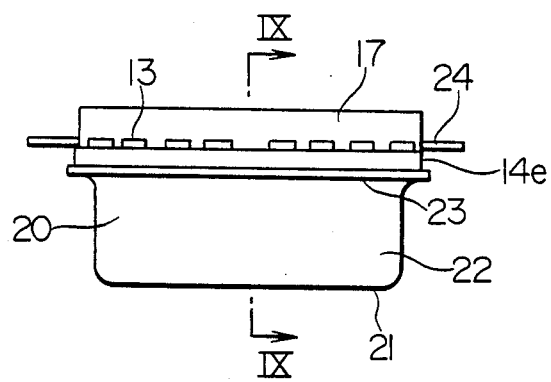
FIG. 8 is a front view of another embodiment of a package structure of a semiconductor device of the present invention.
Figure 9:
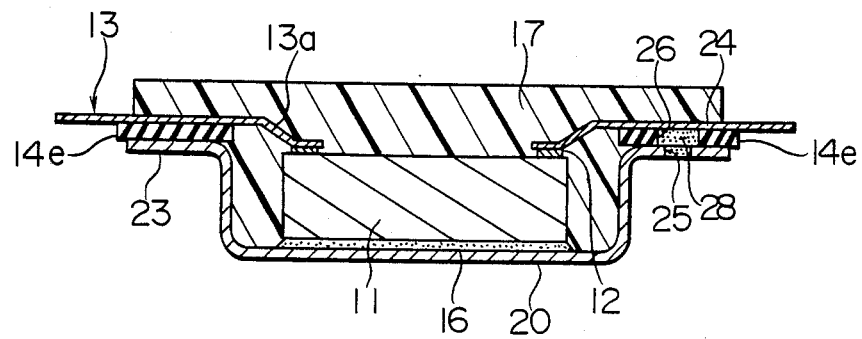
FIG. 9 is a sectional side view of the semiconductor package structure taken along line IX—IX of FIG. 8.
Figure 10:
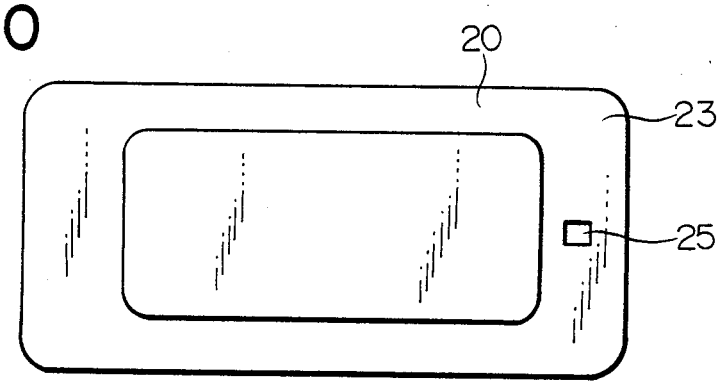
FIG. 10 is a plan view of the metallic cap shown in FIG. 9.

It is seen from FIGS. 6 and 7 that a notch 14c is formed in an inner edge of one of the slits 14b, and that a relatively short lead conductor 13c is attached to a support portion 14d of the tape base material 14 so that the outer end of the conductor 13c extends outwardly beyond the edge of the notch 14c. The short lead conductor 13c is to be connected to the electrode on the upper surface of the semiconductor chip 11 which must be electrically connected to the bottom surface of the chip 11.

Figure 1:
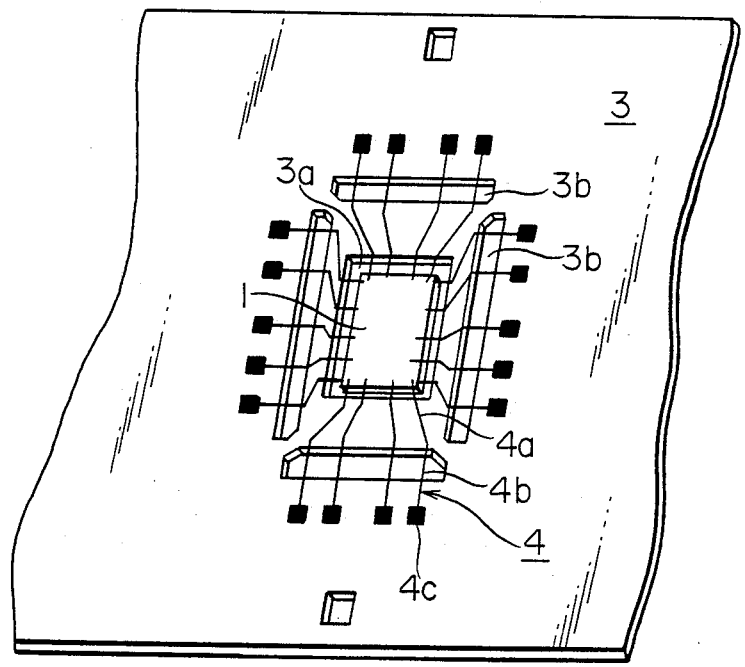
FIG. 1 is a fragmentary perspective view of a semiconductor chip attached to a tape base material according to the conventional TAB method.
Figure 2:
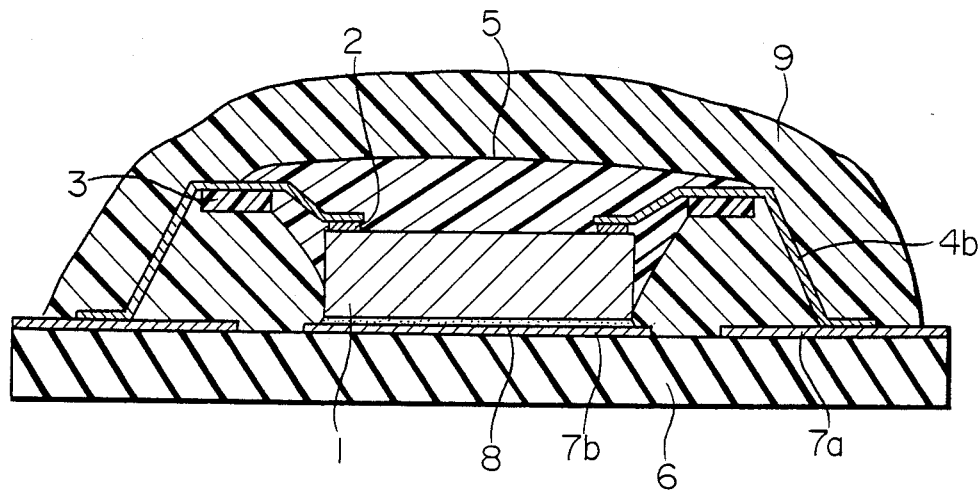
FIG. 2 is a sectional side view of a conventional semiconductor device manufactured by the conventional TAB method.
Figure 3:
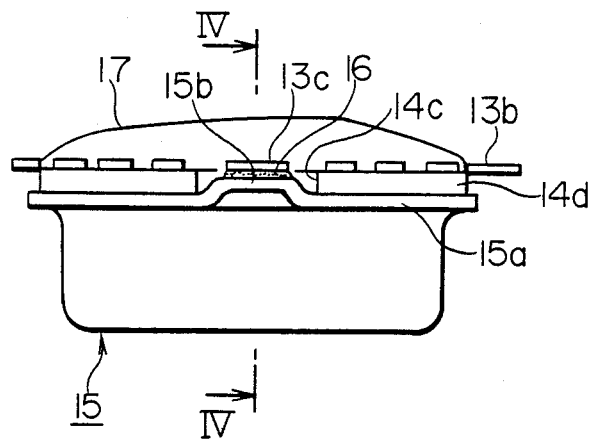
FIG. 3 is a front view of a package structure of a semiconductor device of the present invention.

During the manufacture of the semiconductor device according to the TAB method, the electrodes on the upper surface of the semiconductor chip 11 are bonded to the inner lead connectors 13a and the short conductor 13c by heat bonding. Also during the manufacture of the semiconductor device, as shown in FIGS. 3, 4 and 7, the outer end of the short conductor 13c, which extends into the notch 14c in the slit 14b of the tape base material 14, is bonded by a bonding agent 16, such as an electrically conductive resin or a brazing material, to a flange 15a of a metallic cap 15 illustrated in FIGS. 3 and 4. The metallic cap 15 is also bonded at a bottom wall 15c to the bottom surface of the semiconductor chip 11 by a bonding agent 16 as illustrated in FIG. 4.

The metallic cap 15 comprises the bottom wall 15c to which the bottom surface of the semiconductor chip 11 is electrically and mechanically connected, a side wall 15d extending upwardly from the bottom wall 15c and surrounding the semiconductor chip 11, and the flange 15a extending outwardly from and substantially in parallel to the bottom wall 15c. The flange 15a electrically insulatingly supports the lead conductors 13 thereon by means of the frame-shaped support portion 14d. The flange 15a has a raised portion or a projection 15b which is positioned and dimensioned to fit into the notch 14c in the support portion 14d of the carrier tape base material 14. When assembled, this projection 15d of the flange 15a of the metal cap 15 is electrically connected by the bonding agent 16 to the short lead conductor 13c which is connected to the upper electrode 12 on the upper major surface of the semiconductor chip 11. The support portion 14d of the tape base material is also bonded to the flange 15a of the metal cap 15.

In order to mechanically and electrically protect the assembly thus constructed, an electrically insulating sealing resin 17 is applied to it to complete a semiconductor package illustrated in FIGS. 3 and 4. As shown in FIG. 5, the semiconductor package thus completed is mounted to an electrically insulating substrate 18, on which wiring pattern layers 19 are attached, by electrically connecting wiring pattern layers 19 to the lead conductors 13b. A coating resin is applied to protect the assembly.

FIGS. 8 to 12 illustrate another embodiment of the semiconductor package structure of the present invention. The seimconductor package is manufactured by the TAB method and comprises a metal cap 20 having a bottom wall 21, a side wall 22 and a flange 23. The bottom wall 21 is bonded to the bottom surface of the semiconductor chip 11 and the flange 23 is electrically connected to a lead conductor 24. In order to establish an electrical connection between the lead conductor 24 and the metal cap 20, an opening 25 is formed in the flange 23, a through hole 26 is formed in the support portion 14e of the tape base material, and a large-area region or a connecting pad 27 (FIGS. 11 and 12) is formed in the lead conductor 24. An electrically conductive resinous bonding agent 28 fills the cavity defined by the opening 25 and the hole 26 to electrically connect the flange 23 of the metal cap 20 to the connecting pad 27 of the lead conductor 24. The opening 25, the hole 26 and the connecting pad 27 are substantially aligned and have dimensions so that a certain misalignment of these elements 25, 26 and 27 during the assembly does not impede proper electrical connection between the metal cap 20 and the lead conductor 24 by the electrically conductive bonding agent 28. The bonding agent 28 may be replaced with a brazing material.

Figure 11:
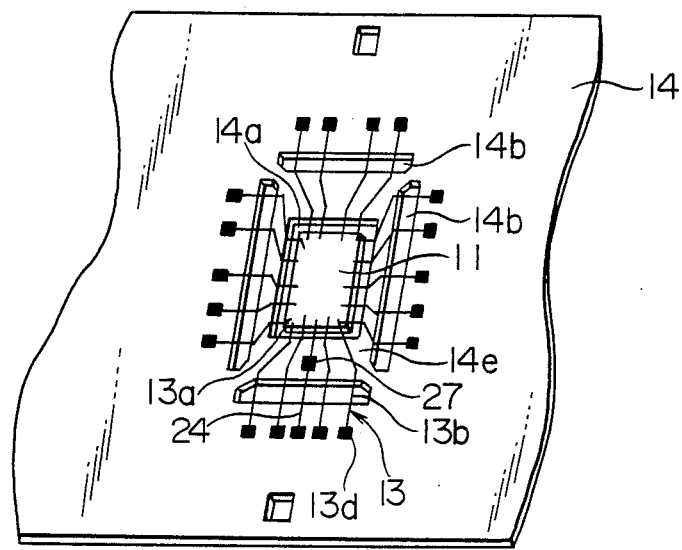
FIG. 11 is a fragmentary perspective view of a semiconductor chip attached to a tape base material according to the TAB method of the present invention.
Figure 12:
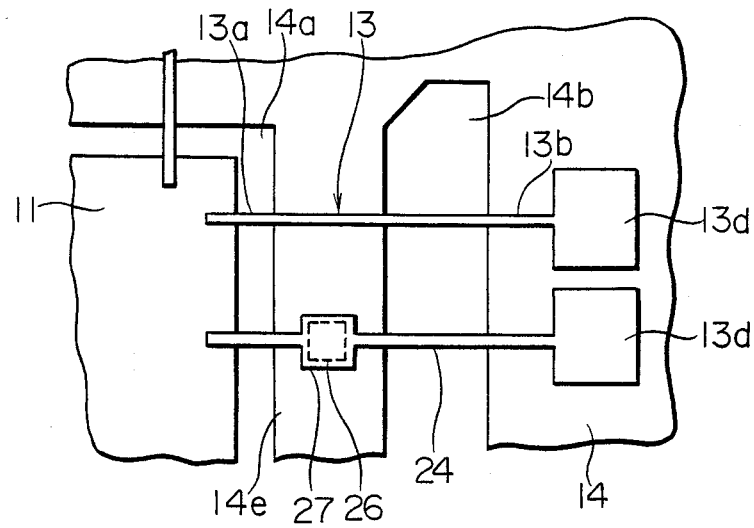
FIG. 12 is an enlarged fragmentary plan view showing the manner in which lead conductor is electrically connected to the metallic cap flange.

FIGS. 11 and 12 illustrate the semiconductor chip 11 attached to the tape base material 14 by lead conductors 13 before the semiconductor chip 11 is separated from the carrier tape. It is seen that the lead conductor 24, including the large-area connecting pad 27, is connected not only to the semiconductor chip 11 but also to one of the test pads 13d on the carrier tape 14. Also, differing from the previous embodiment, none of the outer lead slits 14b has formed therein a notch.

As has been described, according to the present invention, the upper and the bottom surfaces of a semiconductor chip are electrically connected during the TAB method by a metal cap electrically connected to the bottom surface of the semiconductor chip and also to an electrode on an upper surface of the chip. Therefore, the package structure for a seimconductor device can be manufactured by the TAB method and still allows semiconductor device to be tested immediately after the step of bonding the lead conductors to the semiconductor chip is completed and before bonding to the substrate, so that a high yield is realized.

With the structure in which the electrical connection between the metallic cap and the lead conductor is established by an electrically conductive projection integrally disposed on the flange of the metal cap and extending through a notch in the insulating material to be electrically connected to the lead conductor, the projection and the notch serve as a positioning means, so that positioning of the metallic cap relative to the lead conductor is precise and easy.

Further, with the structure in which the electrical connection means comprises an electrically conductive bonding material filled within a cavity defined by an opening in the flange of the metal cap, a through hole in the insulating material and a connecting pad of the lead conductor, the electrical connection can be provided even when the spacing between the lead conductors is narrow.

What is claimed is:

1. A package structure for a semiconductor device to be manufactured by the TAB method and having a semiconductor chip having a first and a second electrode on the first and second major surfaces of the semiconductor chip, respectively, and lead conductors electrically connected to the electrodes, said package structure comprising:

a metallic cap having a bottom wall to which a bottom surface of a semiconductor chip is electrically and mechanically connected, a side wall extending from said bottom wall and surrounding a semiconductor chip, and a flange extending outwardly from said side wall substantially parallel to said bottom wall, said flange supporting lead conductors of the chip through an electrically insulating material; and electrical connection means disposed between said flange of said metallic cap connected to the second electrode of the seimconductor chip and at least one of the lead conductors for connection to the second electrode and for establishing an electrical connection between said flange and at least one of the lead conductors and including an electrically conductive projection integrally disposed on said flange of said metal cap, extending through a notch in said insulating material, and electrically connected to the lead conductor.

2. A package structure for a semiconductor device as claimed in claim 1 comprising a wiring pattern electrically connected to the lead conductors and to said metallic cap and an electrically insulating substrate mechanically supporting said wiring pattern.

3. A package structure for a semiconductor device to be manufactured by the TAB method and having a semiconductor chip having a first and a second electrode on the first and second major surfaces of the semiconductor chip, respectively, and lead conductors electrically connected to the electrodes, said package structure comprising:

a metallic cap having a bottom wall to which a bottom surface of a semiconductor chip is electrically and mechanically connected, a side wall extending from said bottom wall and surrounding a semiconductor chip, and a flange extending outwardly from said side wall substantially parallel to said bottom wall, said flange supporting lead conductors of the chip through an electrically insulating material; and electrical connection means disposed between said flange of said metallic cap connected to the second electrode of the semiconductor chip and at least one of the lead conductors for connection to the second electrode and for establishing an electrical connection between said flange and at least one of the lead conductors and including an electrically conductive bonding material disposed within a cavity defined by an opening in said flange of said metal cap, a through hole in said insulating material, and a connecting pad of the lead conductor.

4. A package structure for a semiconductor device as claimed in claim 3 comprising a wiring pattern electrically connected to the lead conductors and to said metallic cap and an electrically insulating substrate mechanically supporting said wire pattern.

* * * * *